United States Patent [19]

Wilensky

[11] 4,338,592

[45] Jul. 6, 1982

[54] HIGH ACCURACY DIGITAL-TO-ANALOG CONVERTER AND TRANSIENT ELIMINATION SYSTEM THEREOF

[75] Inventor: Samuel Wilensky, Concord, Mass.

[73] Assignee: Hybrid Systems Corporation, Bedford, Mass.

[21] Appl. No.: 120,386

[22] Filed: Feb. 11, 1980

[51] Int. Cl.³ .............................................. H03K 13/02
[52] U.S. Cl. ...................... 340/347 CC; 340/347 DA; 340/347 M
[58] Field of Search .... 340/347 M, 347 DA, 347 CC; 73/362 AR

[56]  References Cited
U.S. PATENT DOCUMENTS 3,217,147 11/1965 Chapman ................ 340/347 DA X
4,029,949 6/1977 Dew ..................................... 364/115
4,117,722 10/1978 Helmstetter ................... 73/362 AR

OTHER PUBLICATIONS

The Engineering Staff of Analog Devices, Inc., Analog-Digital Conversion Handbook, 6/1972, pp. II-32; III-1 to III-4.

Primary Examiner—Thomas J. Sloyan
Attorney, Agent, or Firm—Weingarten, Schurgin & Gagnebin

[57] ABSTRACT

A transient-free, high accuracy digital-to-analog converter is disclosed having a resistor network which generates a plurality of equally weighted currents selectively switched to an output bus to provide an output corresponding to the input code, in which a binary input code is decoded into a specialized code such that an incremental increase in the input code causes an additional one of the equally weighted currents to be coupled to the output bus.

5 Claims, 10 Drawing Figures

HIGH ACCURACY DIGITAL-TO-ANALOG CONVERTER AND TRANSIENT ELIMINATION SYSTEM THEREOF

FIELD OF INVENTION

This invention relates to digital-to-analog converters and more particularly to a method and apparatus for both improving the accuracy of a digital-to-analog converter while at the same time eliminating switching transients which degrade the performance of the converter.

BACKGROUND OF THE INVENTION

Digital-to-analog converters (DACs) have been utilized in the past for such applications as frequency division multiplexing (FDM) telephony, professional audio and a wide variety of other applications in which digital signals are to be converted into their analog counterpart. When digital signals are clocked into the converter at a predetermined rate, the output signal from the digital-to-analog converter is an analog replica of the digital signal. For most digital-to-analog converters, the analog voltages or currents, are developed by so-called current sources which are resistor controlled. The conventional resistor matrix, which is utilized in the generation of the analog currents or voltages, is a so-called R, 2R network, which is configured so as to be able to accommodate a binary input code which controls switches which connect various resistors in a network from a voltage reference source to an output bus. The output currents are thus binary weighted, so that the R, 2R network is one-to-one compatible with the binary number coding system. The result of proper combining of the binary weighted currents is a system which produces linear incremental voltage steps for incremental number increases in the binary input code.

There are essentially two major problems with the R, 2R digital-to-analog converters. The first problem is the accuracy to which a digital input code can be converted to an analog voltage. This accuracy depends very heavily on the tolerances of the resistive elements in the resistor matrix. In an R, 2R network, the tolerance is not merely the tolerance of a single resistive element, but rather the combined tolerance of many series/parallel connected resistive elements since the R, 2R network operates with series/parallel combinations of resistive elements. Thus, for instance, to achieve a 0.0008% tolerance in the output voltage for a 16 bit DAC, at least one resistive element must have a tolerance of 0.0016%. Note, that 0.0016% tolerances are almost impossible to achieve in the present state of the art.

The second problem with the R, 2R network is that due to the binary switching system, transients occur when various transistors switch from one state to another in accordance with a change in input code. These transients are called "glitches" which bespeaks their undesirability and is a problem which has plagued digital-to-analog converters since their inception.

When utilizing R, 2R networks, the glitch is generated because of the difference in switching times to turn a transistor ON versus the time it takes to switch it OFF. In an R, 2R network going from one code to another, it is often times necessary to turn one switch ON while "simultaneously" turning another switch OFF. In matter of fact, because switches do not turn ON as fast as they turn OFF, one cannot "simultaneously" turn one switch OFF and another ON or vice versa. The result is that the output voltage of the digital-to-analog converter momentarily swings towards 0 volts or full maximum during the time period in which the switches are not acting "simultaneously." In summary, for an R, 2R network, there will always be transitions in the input code which will result in some of the switches being turned OFF while some of the switches are being turned ON. Due to the differential in the reaction times of the switches depending on which direction they are switching, transients result which are extremely annoying and detrimental especially when the output of the digital-to-analog converter is utilized to drive a cathode ray tube.

Some applications can forgive this shortcoming. But when digital-to-analog converters are utilized to drive the beam deflection circuits of a cathode ray tube (CRT) graphic display system, distortion caused by glitches, is easy to see and more than just annoying. Converters used for this purpose must have short settling times and high current drive capability in addition to producing a low glitch level. Rapid settling is vital to flicker-free display of complex patterns. In general to avoid flicker, the converter must be able to update at about 10 MHz or faster.

While many current state of the art digital-to-analog converters can provide the fast settling and high current output needed to drive cathode ray tubes, a low glitch level has remained elusive. De-glitching techniques in the past have involved the use of sample and hold circuitry which is normally operated in the track mode and is switched to the hold mode just before the converter is updated. When the converter has settled to the new value, the sample and hold is switched back to the track mode. Thus the glitch period is effectively isolated from the output.

Of course, to be effective, the sample and hold circuit itself should not introduce significant voltage spikes at the output. In addition to the costs of the sample and hold circuit which can be as high as that of a converter of comparable speed and resolution, this technique introduces extra delay due to the sample and hold acquisition time. This usually limits the update rate to two MHz or less. Additional error from sample and hold offset and "droop" can be expected.

Another anti-glitching technique useful for graphic display systems that can tolerate a lower converter update rate is a bandwidth or slew rate limited circuit. In one example of such a de-glitching system, a balanced diode bridge is utilized in which any fast changing signal-like glitches are filtered out. Unfortunately, this increases a converter's overall response time, thus reducing the ability of the converter to operate at high frequencies.

In another conventional de-glitching technique, multiplying converters are used to circumvent glitch problems in CRT graphic display systems. A multiplying converter's analog output is proportional to the product of a variable reference and the input code. In a typical setup, a pair of current-output converters drive each CRT input (X deflection and Y deflection). The two fixed-reference converters determine the position of a starting point of the display line. Their outputs are summed with the external variable-resistance (multiplying) digital-to-analog converters, which are driven by a 0 to 10 volt ramp reference. The ratio and magnitude of the multiplying units digital codes, determine the slope and length respectively of the line being generated on the display. Complex display characters are made up of a series of these straight lines. Since glitches occur only when the converter input codes are changing, this step minimizes the code updating as the beam is essentially being driven by the ramp. In addition, the input codes can be changed during the retrace of the beam when the screen is usually blanked.

While this method offers a solution to the glitch problem in a CRT display system, its most obvious limitation is the cost of two extra converters. Moreover, the updating logic is more complex, as four converters must be updated instead of two. Finally, only one straight line segment may be drawn per sweep, so that in a complex character generating system, where many such segments are required, the devices must have a very fast settling time, 100 nanoseconds or less.

SUMMARY OF THE INVENTION

Both of the above-mentioned problems, accuracy and switching transients, are solved in the subject invention by the provision of a "decoded" DAC. The differences between the decoded DAC and the conventional DAC are first that it includes a different type of resistor network which is one in which resistors, each having the same weight, are connected in parallel by corresponding switches between a reference voltage and an output bus. Put another way, the resistor network generates equal currents at the output nodes corresponding to the bits. This is unlike the R, 2R network which produces binary weighted currents.

Secondly, the binary input code is converted to a specialized code for the actuation of the switches for the network. Here the binary input code is converted into a code in which an increment in the binary number results in the adding in parallel of an additional resistor to the remainder of the resistors already connected between the reference source and the output bus.

This system has two advantages. The first advantage is that no one resistor contributes more than its fractional part of the total resistance network to error. Thus if sixteen bits are utilized, involving sixteen different resistors, then each resistor contributes no more than one-sixteenth of the total error. This means that in order to obtain a 0.0008% accuracy DAC, no resistor need have an accuracy exceeding 0.0128%, which is almost an order of magnitude less accuracy than that for a corresponding R, 2R ladder. This is because in the R, 2R networks resistors can contribute as much as half the error for the most significant bit (MSB).

Secondly, because of the decoding of the binary input code and the manner in which the resistor elements are added in parallel, there is no situation in which one switch is to be turned ON while another switch is to be "simultaneously" turned OFF for any given input code change. This means that for those switches which in fact change state for a change in input code, they are all either being turned ON or being turned OFF. Thus no "glitch" occurs for any change in input code.

In summary, in going from any output state to any other output state, switches are either turned ON or turned OFF, but there is never a situation in which for a given transition, some switches are turned ON and some switches are turned OFF. Thus, there is never a problem of some switches actuating before other switches, which produces the "glitches."

Thus in one embodiment the subject invention involves a high accuracy digital-to-analog converter in which the binary input code is decoded into a specialized code in which an incremental increase in the input code causes an additional resistor to be connected in parallel with the rest of the resistors from a reference source to an output bus. The resistor network has equally weighted elements switched in parallel from a reference voltage to an output bus to provide the current or voltage output corresponding to the input code.

As one aspect of the subject invention, the particular resistor network utilized is manufactured such that the resistive elements are laid out between a reference voltage bus and a switch contact as opposed to developing a serially connected resistor string between the reference voltage source and ground, with switches tapped between adjacent resistive elements. In this latter case, laser trimming of one resistor in the resistor dividing network would result in changes of resistance throughout the resistor string, whereas the parallel connection technique which is utilized, results in the ability to trim a particular resistive element without affecting the resistance of the other elements.

In a further aspect, trimming is even more easily accomplished by the interposition of small trimming resistors between the main resistive elements. When equallizing the currents starting from the least significant bit (LSB) resistor, any current imbalance due to over-trimming of a main resistor can be compensated by trimming a corresponding trimming resistor to make all lower significant bit currents equal to that produced by the over-trimmed main resistor.

As another aspect of the subject invention, in order to eliminate the effect of switch resistance, the output of the switching unit is buffered with a high impedance operational amplifier. Since switch contact resistance or the equivalent is exceptionally small compared with the high impedance input to the operational amplifier, the effect of switch resistance on the output voltage developed by the digital-to-analog converter is virtually eliminated.

In one embodiment of the subject invention, the subject decoded DAC is utilized in combination with the conventional R, 2R ladder technique or conventional binary weighted DAC, with the conventional DAC being responsible for the generation of a certain number of least significant bits, and with a smaller number of most significant bits being generated in accordance with the output of the decoded DAC. Since it is more important that the most significant bits be extremely accurate, the decoded DAC provides for the high accuracy and also for the low switching transients, whereas the conventional DAC provides for all points intermediate the adjacent most significant bits determined by the decoded DAC. Thus a technique is utilized in which a combination of the two DACs provides for a maximum of accuracy and glitch rejection with a minimum number of resistive elements.

When viewing the magnitude of the output signal from the digital-to-analog converter, it has been found, in an 18 bit converter that by processing the four most significant bits with the decoded DAC and the remaining fourteen least significant bits with a conventional DAC, the accuracies afforded by the decoded DAC are available in a true eighteen bit system. In other words, by generating the four or so most significant bits with increased accuracy, it is possible to provide an eighteen bit DAC with exceptionally accuracy which could not be achieved by utilizing the conventional R, 2R ladder alone.

Additionally, in one embodiment of the subject invention the decoding circuit which decodes the binary input code is provided with a latching circuit such that the decoder outputs are read out all at the same time, thereby avoiding any asynchronous operation of the switches in the resistor network. This insures the "simultaneous" operation of the switches so that even though the switches only operate in one direction, they also are actuated all at the same time.

BRIEF DESCRIPTION OF THE DRAWINGS

The novel features that are considered characteristic to the present invention are set forth in the appended claims. The invention itself, however, both as to its organization and method of operation together with additional objects and advantages thereof, will best be understood by not only the preceeding, but by the following description of a preferred embodiment or embodiments read in conjunction with the accompanying figures in which:

DETAILED DESCRIPTION

Figure 1:
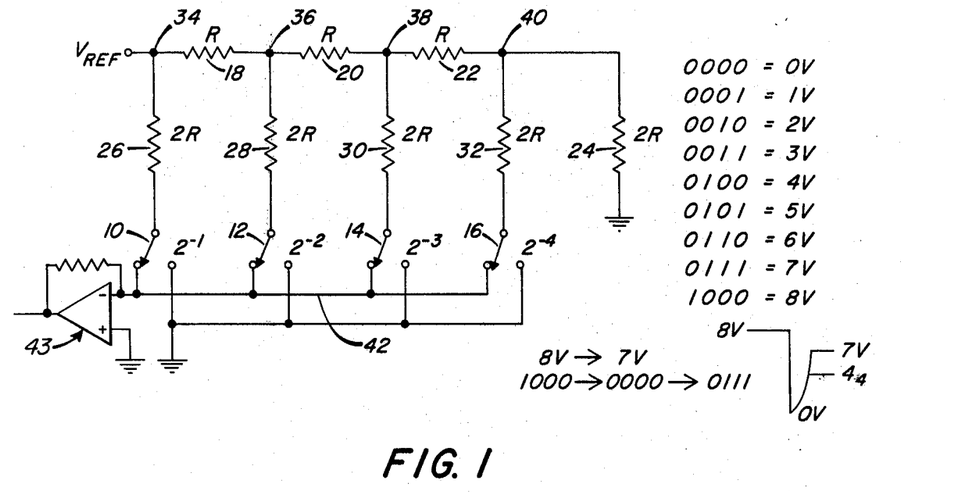
FIG. 1 is a schematic diagram of an R, 2R network and accompanying binary code conversion table.

Referring now to FIG. 1, an R, 2R ladder network is illustrated in which the ladder is connected between a reference bus $V_{ref}$ and a series of single pole double throw switches, 10, 12, 14 and 16. The R, 2R ladder is made up of resistors 18, 20, 22, and 24 connected between $V_{ref}$ and ground with resistors 26, 28, 30 and 32 connected at inter-connection points 34, 36, 38 and 40 as illustrated.

Resistors 18 through 22 have a value R whereas the values of resistors 24 through 32 have a value 2R. An output bus 42, coupled to an output amplifier 43, is connected to one of the terminals of each of switches 10 through 16, whereas the other terminals of the switches are connected to ground. Switch 10 controls the most significant bit whereas switch 16 controls the least significant bit, with the binary number associated with each switch, being shown immediately to the right of the switch.

To the right of this diagram is a binary code and the associated relative voltages which are available on output bus 42 as the result of positioning the switches in accordance with the particular code.

For the 0000 code, all of the switches connect their respective resistors to ground. A "1" in the code indicates that the particular switch involved is switched from ground to the output bus.

The most troublesome transition in the binary code is one in which a transition from 8 volts to 7 volts is required. In this case with the most significant bit ON and the other bits OFF, the change requires that the most significant bit be turned OFF and all of the rest of the bits be turned ON, e.g. going from code 1000 to code 0111.

As mentioned hereinbefore due to the differential switching speed, it takes longer for the least significant bit switches to switch ON versus the time it takes for the most significant bit switch to be turned OFF. Thus there is in essence an intermediate state of 0000 when switching from 1000 to 0111. This results in a transient in the output voltage here illustrated at 44 in which in going from 8 volts to 7 volts, a downwardly projecting spike occurs. This is one type of glitch mentioned previously.

Figure 2:
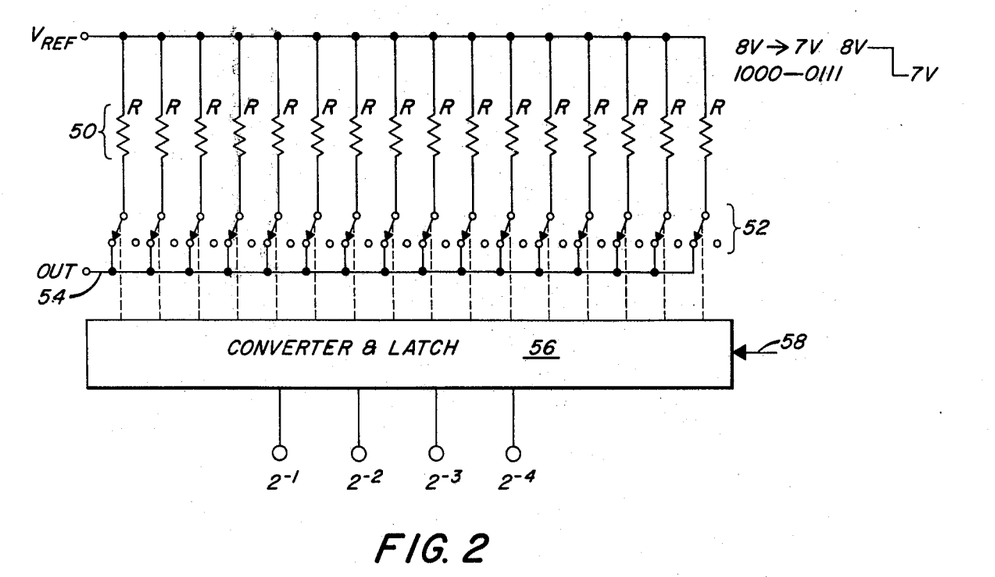
FIG. 2 is a schematic diagram of the subject resistor network illustrating, inter alia, a glitch free transition from one input code to another.

In order to avoid the transient engendered by going from code to code, a resistor matrix such as illustrated in FIG. 2 is utilized. In this embodiment, identical resistive elements 50 are connected between a reference voltage $V_{ref}$ and a switching matrix here illustrated at 52. The values of these resistors are shown to be equal as indicated by the reference character R. These switches are also single pole double throw switches in which only one of the output terminals of each switch is coupled to an output bus 54. The switch matrix 52 is controlled by a converter and latch circuit 56 which converts a binary input code into the specialized code described hereinabove, with a particular input being decoded and latched until such time as a read-out signal applied at 58 causes the switches to be repositioned all at one time. The result of this is a glitch-free transition from, for instance, 8 volts to 7 volts with an input code change from 1000 to 0111.

The converter and latching circuit are described hereinafter in connection with FIG. 8. What has been provided is a circuit and switching system in which the conversion takes place in accordance with the following truth table:

TABLE I

| Decoder input $2^{-1}2^{-2}2^{-3}2^{-4}$ | | | | Decoder output Outputs to current switches | | | | | | | | | | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 1 |
| 0 | 0 | 1 | 0 | 0 | 0 | 0 | 0 | 0 | 0 | 0 | 0 | 0 | 0 | 0 | 0 | 1 | 1 |
| 0 | 0 | 1 | 1 | 0 | 0 | 0 | 0 | 0 | 0 | 0 | 0 | 0 | 0 | 0 | 1 | 1 | 1 |
| 0 | 1 | 0 | 0 | 0 | 0 | 0 | 0 | 0 | 0 | 0 | 0 | 0 | 0 | 1 | 1 | 1 | 1 |

TABLE I-continued

| Decoder input $2^{-1}\ 2^{-2}\ 2^{-3}\ 2^{-4}$ | | | | Decoder output Outputs to current switches | | | | | | | | | | | | | | |
|---|---|---|---|---|---|---|---|---|---|---|---|---|---|---|---|---|---|---|
| 0 | 1 | 0 | 1 | 0 | 0 | 0 | 0 | 0 | 0 | 0 | 0 | 0 | 0 | 1 | 1 | 1 | 1 | 1 |
| 0 | 1 | 1 | 0 | 0 | 0 | 0 | 0 | 0 | 0 | 0 | 0 | 0 | 1 | 1 | 1 | 1 | 1 | 1 |
| 0 | 1 | 1 | 1 | 0 | 0 | 0 | 0 | 0 | 0 | 0 | 0 | 1 | 1 | 1 | 1 | 1 | 1 | 1 |
| 1 | 0 | 0 | 0 | 0 | 0 | 0 | 0 | 0 | 0 | 0 | 1 | 1 | 1 | 1 | 1 | 1 | 1 | 1 |
| 1 | 0 | 0 | 1 | 0 | 0 | 0 | 0 | 0 | 0 | 1 | 1 | 1 | 1 | 1 | 1 | 1 | 1 | 1 |
| 1 | 0 | 1 | 0 | 0 | 0 | 0 | 0 | 0 | 1 | 1 | 1 | 1 | 1 | 1 | 1 | 1 | 1 | 1 |
| 1 | 0 | 1 | 1 | 0 | 0 | 0 | 0 | 1 | 1 | 1 | 1 | 1 | 1 | 1 | 1 | 1 | 1 | 1 |
| 1 | 1 | 0 | 0 | 0 | 0 | 0 | 1 | 1 | 1 | 1 | 1 | 1 | 1 | 1 | 1 | 1 | 1 | 1 |
| 1 | 1 | 0 | 1 | 0 | 0 | 1 | 1 | 1 | 1 | 1 | 1 | 1 | 1 | 1 | 1 | 1 | 1 | 1 |
| 1 | 1 | 1 | 0 | 0 | 1 | 1 | 1 | 1 | 1 | 1 | 1 | 1 | 1 | 1 | 1 | 1 | 1 | 1 |
| 1 | 1 | 1 | 1 | 1 | 1 | 1 | 1 | 1 | 1 | 1 | 1 | 1 | 1 | 1 | 1 | 1 | 1 | 1 |

With respect to the accuracies obtainable by the subject resistor network, it will be apparent that since the values on the output bus are not obtained by combinations of resistive elements in series and parallel, the accuracy is dependent on the accuracy of the resistors themselves. Thus if 10% resistors are utilized, the linearity of the output will be on the order of $10\%/16 = 1/1.6\% \approx 0.7\%$. This means that contrary to the R, 2R ladder, the most significant bit resistor contributes only 1/16th of any error when a 16 bit converter is utilized. In an R, 2R ladder, the most significant bit resistor contributes half of the error and obviously effects the analog output voltage considerably more than the least significant bit resistor.

Figure 3:
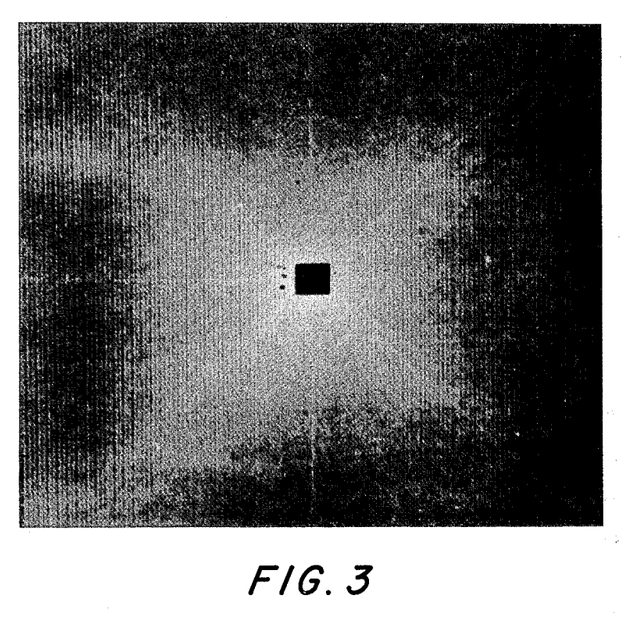
FIG. 3 is a photograph of a CRT display illustrating, by the vertically running dark lines, the effects of switching transients when utilizing a conventional DAC.

Referring to FIG. 3, a graphic illustration of the types of glitches which are unacceptable in graphic displays is depicted in which the effects of glitches on a CRT are easily demonstrated. Since the position of the electron beam is determined by the voltages (outputs from the digital-to-analog converters) at the X and Y inputs of the CRT, any spikes or transients that appear at these inputs, will displace the beam momentarily from its course or position. The direction of displacement is dependent upon the origin (X or Y input) and the polarity of the glitch.

If the X input of a CRT is driven by a conventional converter and the Y input is driven by a low glitch converter or decoded DAC, as illustrated in FIG. 3, the effect of glitches becomes clear. The digital inputs to the digital-to-analog converters are generated by a computer program to produce a spoke pattern. If neither converter produced any glitches, the display would consist of straight lines radiating from the center. Glitches in the output of the X axis converter displace the converter momentarily to the left. The result is a series of vertical lines with each line representing a major transition, the point where a glitch occurs. In an alpha numeric display, the glitches cause distortion in the shape of the characters.

Because no switches are turned on and off at the same time in the subject decoded DAC, glitches such as those illustrated in FIG. 3, can be eliminated.

Figure 4:
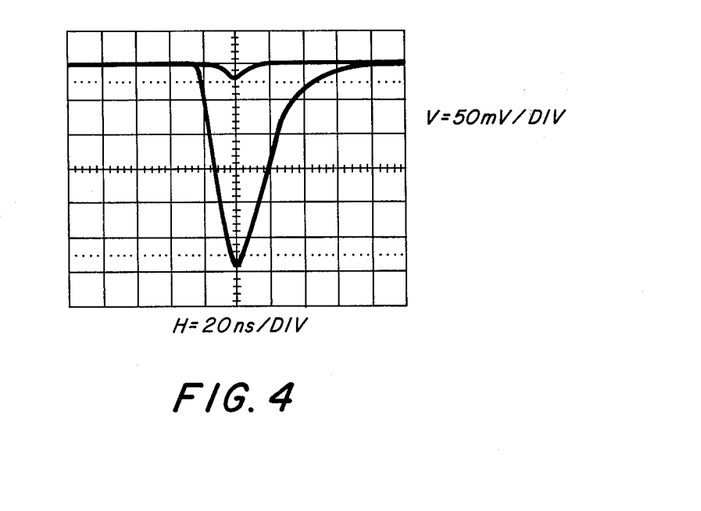
FIG. 4 is a photographic representation of an oscilloscope trace of the difference between a transient caused in a conventional DAC and the transient which is the result of the subject decoded DAC.

To illustrate, and referring to the oscilloscope trace of FIG. 4, glitches produced at major transitions by a conventional digital-to-analog converter and the decoded digital-to-analog converter, are compared. As will be seen, the large excursion occasioned by the utilization of a conventional DAC is nearly one-half the full one volt output. The amplitude of the decoded DAC in this case is, smaller by a factor of 16. Not only does the subject DAC result in decreased transients, but the settling time for the subject decoded DAC is much shorter.

Figure 5:
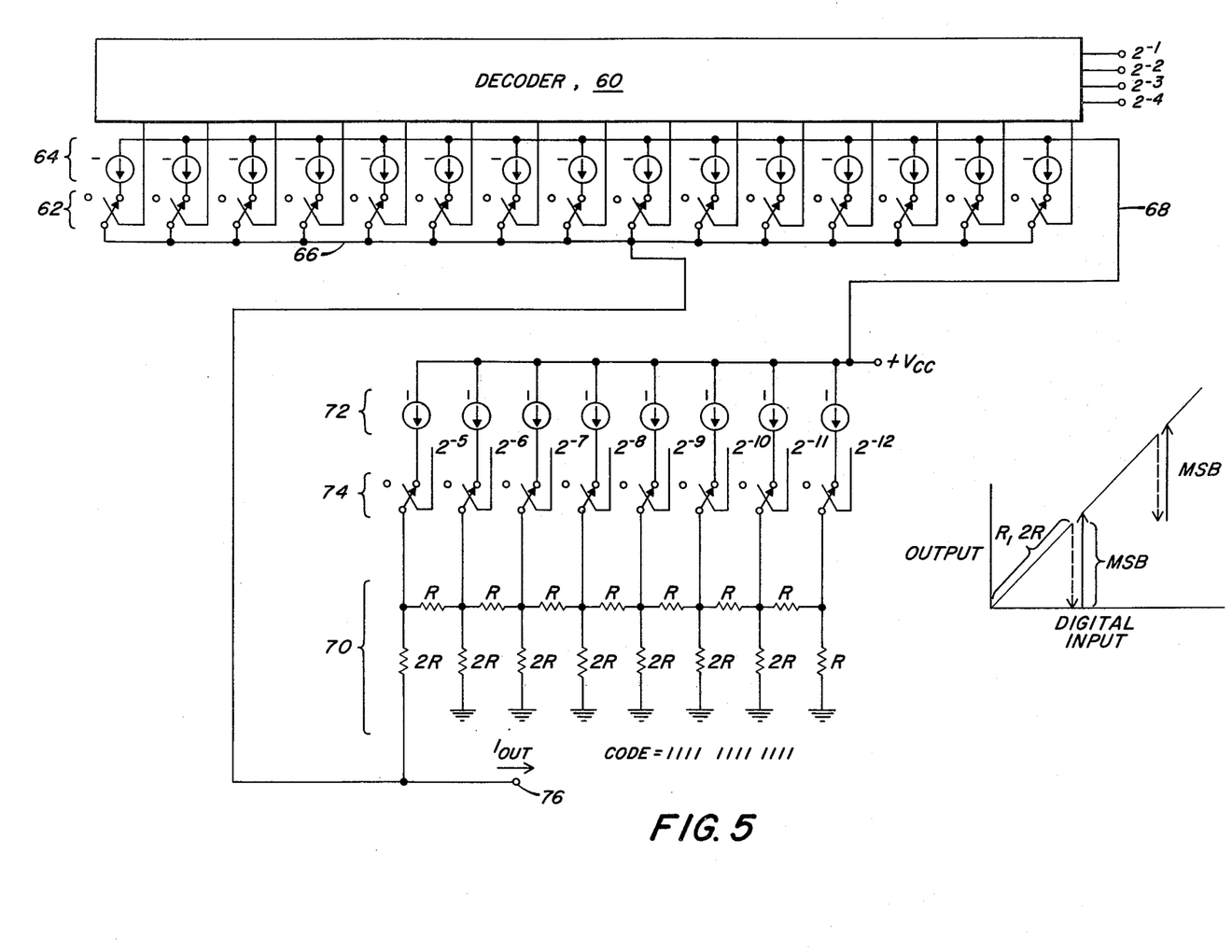
FIG. 5 is a block and schematic diagram illustrating the combination of a conventional DAC with a decoded DAC so as to provide a maximum number of bit conversions with a minimum number of resistive elements while maintaining high accuracy and a low glitch level.

Referring now to FIG. 5, in a multi-bit DAC, the most significant bits may be generated through the utilization of a decoded DAC, whereas the least significant bits in between these most significant bits may be produced by a conventional DAC. In order to accomplish this, the most significant bits are coupled to a decoder 60 which operates in accordance with the aforementioned truth table to position switches designated at 62 to connect current sources diagrammatically illustrated at 64 to an output bus 66. The reference voltage $V_{cc}$ is applied over line 68 to the current sources. It will be appreciated that the resistor matrix of FIG. 2 is exactly equivalent to the FIG. 5 showing of current sources and the current source designation is therefore considered proper.

The remaining least significant bits are generated by the R, 2R ladder diagrammatically illustrated at 70 which is fed by current source 72 coupled through switches 74. This is an alternative and equivalent circuit to that shown in FIG. 1 and operates in the same way as described above.

The output current at terminal 76 is developed as illustrated in the graph to the right of FIG. 5, in which the digital input code is graphed against output current. As can be seen, the linear portions of the curve are generated by the R, 2R network whereas the most significant bit transitions are as illustrated.

It will be appreciated that in generating an analog signal from a digital signal, it is the most significant bits which are the most important in obtaining the accuracy required, since they contribute the largest amount to the output. The combination of utilizing the decoded DAC with the conventional DAC therefore provides increased accuracy for large numbers of bits.

Figure 6:
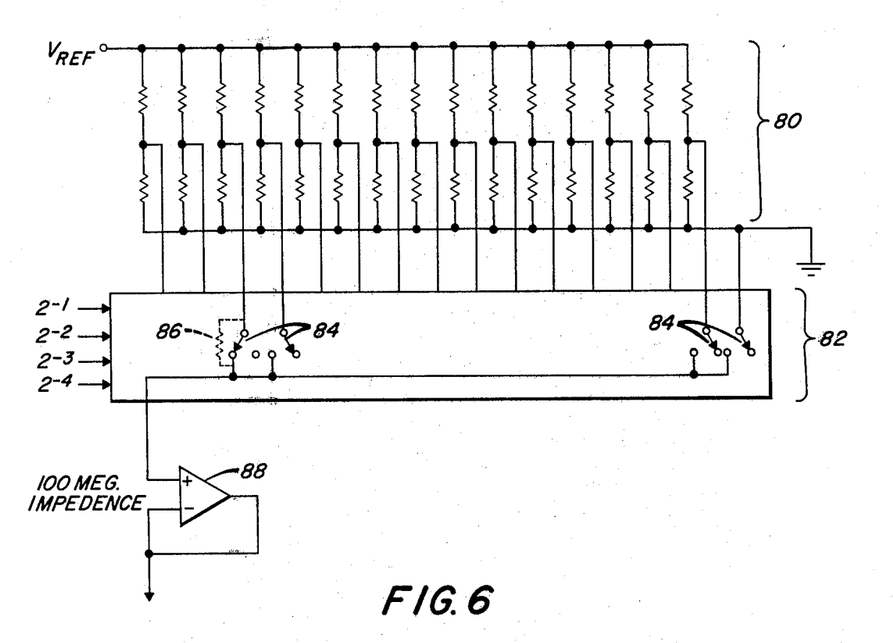
FIG. 6 is a schematic diagram illustrating the utilization of a high impedance buffer to buffer the output of the switching circuit utilized with the subject decoded DAC.

Referring now to FIG. 6, the resistor network of the subject invention, can be generated with an array of voltage dividers as illustrated at 80 in which the voltage dividing circuit is connected from the reference bus to ground. The taps between the two resistive elements in the voltage dividing circuit are coupled to the aforementioned switching circuit here illustrated at 82 which contains, for example, the switches illustrated at 84. As will be appreciated in any type of switch, there is some switching resistance here illustrated by the dotted resistor 86 associated with the switching contacts. In order to eliminate the effect of switching resistance on the output of the decoded DAC, a high impedance operational amplifier such as illustrated at 88 may be employed which, in one embodiment may have a 100 megohm input impedance. The result of utilizing this type of buffering with the subject DAC is that it completely eliminates the problem of having to compensate for switch contact resistance or the equivalent thereof.

Figure 7:
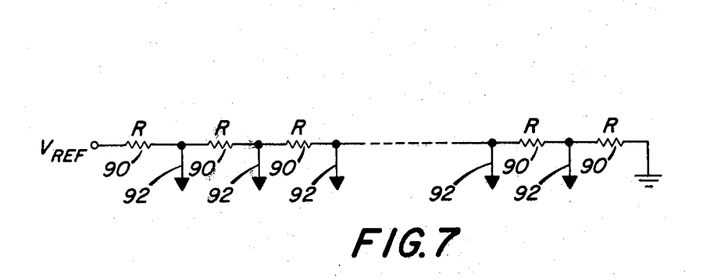
FIG. 7 is schematic illustration of a serial resistor string, the trimming of which is difficult as compared to the subject arrangement.

Referring now to FIG. 7, it will be appreciated that it is possible to produce the subject resistance network by utilizing the voltage dividing network illustrated in FIG. 7. In this embodiment serially connected resistors 90 are illustrated connected between $V_{ref}$ and ground. The requisite voltages are tapped as illustrated by arrows 92 and it is indeed possible to use this type of voltage dividing circuit for the subject DAC. However, the circuits illustrated in FIGS. 2 and 6 are much preferable insofar as the resistive elements can be laser-trimmed one at a time without effecting any of the other resistor elements. Laser-trimming of one of the resistors in the voltage dividing circuit of FIG. 7 results in changing the voltages for currents generated through the utilization of all of the resistors such that trimming one resistor affects voltages at the taps between the rest of the resistive elements. It is therefore a feature of one aspect of this invention to provide the configuration shown in either FIGS. 2 or 6, so that laser-trimming can be accomplished easily.

Figure 8:
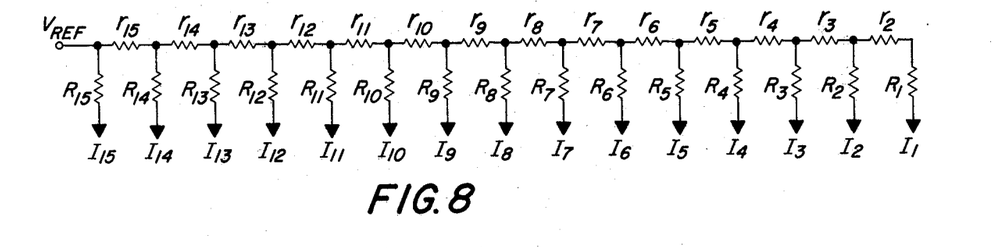
FIG. 8 is a schematic diagram of an easily trimmable resistor network which produces equal currents at its output nodes.

In a still further embodiment it is possible to correct for over-trimming of a given resistor in the resistor network of FIG. 2 without retrimming other resistors through the utilization of the resistor network in FIG. 8. In this network, resistors $R_1$ through $R_{15}$ are not equally weighted and, as can be seen resistors $r_2$ through $r_{15}$ interconnect the resistors $R_1$ through $R_{15}$. The resistor ladder shown in FIG. 8 is arranged such that the currents generated by resistors $R_1$ through $R_{15}$ are equal. Thus $I_1 = I_2 = I_3 \ldots = I_{15}$. This may be accomplished by giving the resistors the values shown in Table II.

TABLE II

| | Kohms | | Ohms |
|---|---|---|---|
| $R_1$ | 66.666 | $r_2$ | 294.167 |
| $R_2$ | 67.255 | $r_3$ | 197.5 |
| $R_3$ | 67.849 | $r_4$ | 150 |
| $R_4$ | 68.447 | $r_5$ | 120.833 |
| $R_5$ | 69.051 | $r_6$ | 101.666 |
| $R_6$ | 69.661 | $r_7$ | 87.5 |
| $R_7$ | 70.276 | $r_8$ | 77.5 |
| $R_8$ | 70.896 | $r_9$ | 69.166 |
| $R_9$ | 71.522 | $r_{10}$ | 63.333 |
| $R_{10}$ | 72.153 | $r_{11}$ | 57.5 |
| $R_{11}$ | 72.790 | $r_{12}$ | 53.333 |
| $R_{12}$ | 73.432 | $r_{13}$ | 50 |
| $R_{13}$ | 74.080 | $r_{14}$ | 46.666 |
| $R_{14}$ | 74.734 | $r_{15}$ | 44.166 |
| $R_{15}$ | 75.394 | | |

It will be appreciated in typical laser trimming operations a mistake most often made is that a given resistor is over-trimmed. Since it is exceedingly difficult to add material to a resistor matrix, with the over-trimming of the particular resistor, all of the other resistors must be trimmed, which means going over the resistor matrix a number of times in order to obtain equal currents.

The system illustrated in FIG. 8 is more easily trimmed while at the same time providing a series of, in this case, 15 equal current sources. Assuming that resistor $R_1$ is appropriately set, then resistor $R_2$ may be trimmed. If resistor $R_2$ is over-trimmed it is possible to remove material from $r_2$ such that the current running from $V_{ref}$ to $R_1$ is reduced to the point that $I_2 = I_1$.

The resistor network is trimmed from the least significant bit ($R_1$) to the most significant bit ($R_{15}$) such that if for instance $R_6$ is over-trimmed, resistor $r_6$ is trimmed such that all currents to the right of $I_6$ (e.g. all less significant bits) equal that of $I_6$. For instance, if $R_1$ through $R_5$ are trimmed so as to provide 15 mil current sources, and if $R_6$ is over trimmed such that $I_6$ is only producing 14 mils of current, then $r_6$ may be trimmed such that $I_1$ through $I_5$ now produce currents of 14 mils.

This process is repeated until the entire ladder is trimmed to a point of producing equal currents.

It will be appreciated that the desired result is to have a minimum in the ratio between the main resistors and the trimming resistors to facilitate trimming and in some cases this may be as low as 100 to 1. On the other hand, it is important to minimize the voltage drop from $V_{ref}$ to the junction of $R_1$ and $r_2$ by minimizing the values of $r_{15}$ through $r_2$. The lower this voltage drop, the less the effect on the equal valued main resistors. This is an engineering trade off. Note, ratios of between 100 to 1 and 1,000 to 1 produce acceptable results.

What will be appreciated is that, when trimmed in this manner, the trimming resistors permit easy adjustment for the current sources to the right of the resistor which is over trimmed. Thus, only one trimming resistor need be trimmed to adjust the entire network for a given over-trimming situation.

Figure 9:
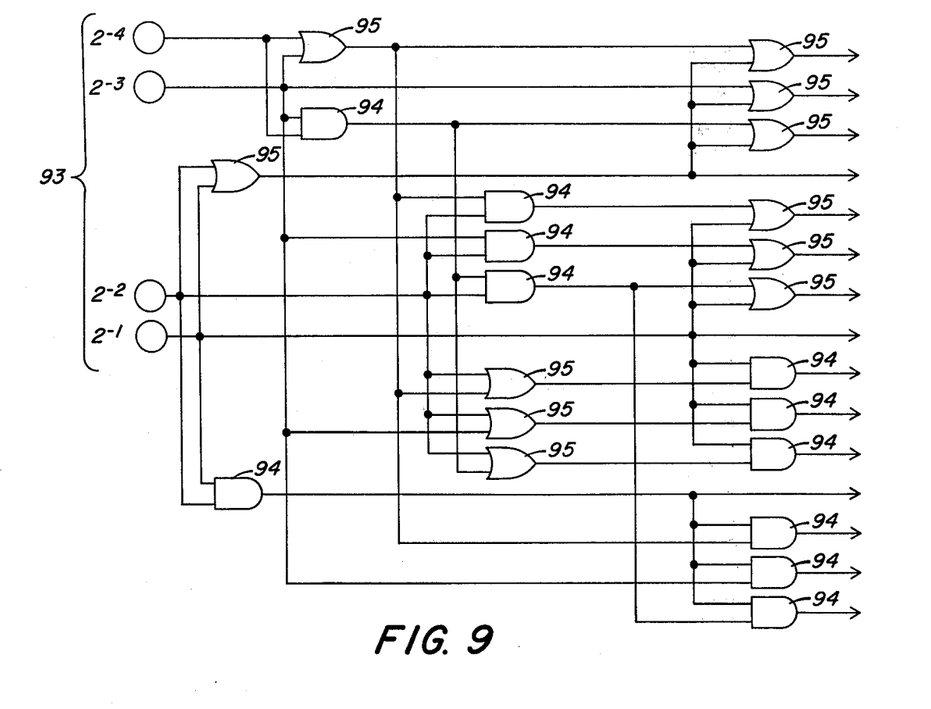
FIG. 9 is a schematic diagram of a decoder for the decoded DAC.

A decoder which performs the functions described in the aforementioned truth table is described in connection with FIG. 9, in which binary inputs at 93 are decoded by the input terminal AND gates 94 and two input terminal OR gates 95 in accordance with the truth table of Table I.

Figure 10:
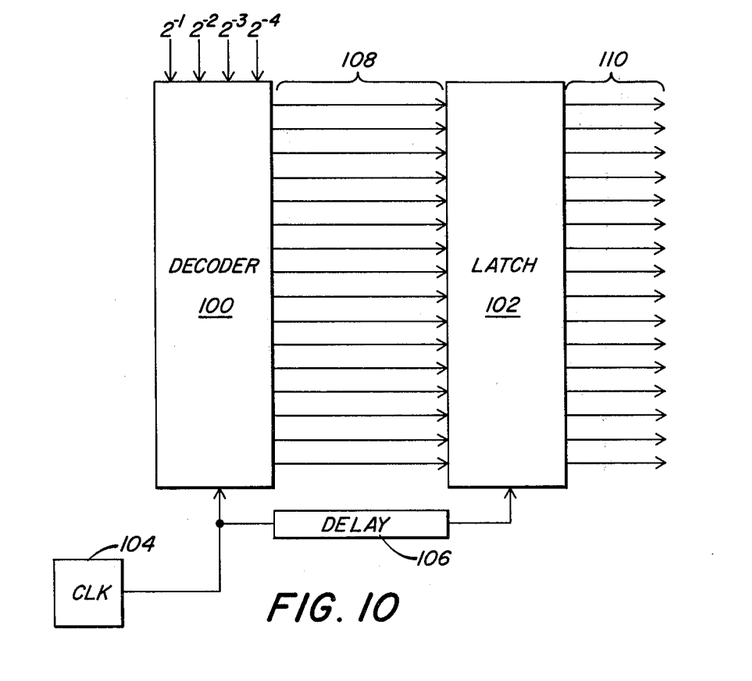
FIG. 10 is a block diagram of a decoder/latch circuit for use with the subject invention.

Referring now to FIG. 10, a decoder and latch circuit are schematically illustrated. It is the purpose of the decoder to decode the binary input code as described in accordance with the aforementioned table. It is the purpose of the latch circuit to store the previous decoder outputs until the decoder has settled after a data change. The latching outputs are then read out all at one time.

As illustrated in FIG. 10, a decoder 100 is connected to a latch circuit 102 and is clocked by a clock 104, with a delay 106 being interposed between the decoder and latch circuit.

Upon the occurrence of a clock pulse, which changes the decoder input, decoder 100 decodes the new binary input code and produces logic level signals on output lines 108. In the decoding, there is a possibility that the output signals on lines 108 will not reach the desired logic level signal in a synchronous manner. Latch 102 is therefore interposed so that the output signals on 108 are sampled and held until such time as a clock pulse from delay unit 106 actuates the latching circuit so as to dump the contents of the decoder onto output lines 110. Since this is done all at one time, the switches in the switching matrix are actuated simultaneously thereby reducing switching transients to an absolute minimum. Latch circuits are conventional and are not described herein.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A method of compensating a digital-to-analog converter of the type which includes a resistor network which provides equally weighted currents at the output nodes thereof by virtue of providing a string of serially connected trimming resistors, one end of the string being coupled to a voltage source, and main resistors, each, with the exception of the LSB main resistor, being connected at one end thereof to a junction between adjacent trimming resistors and each being selectively coupled at the other end thereof either to a load or ground, comprising the steps of trimming the main resistors starting with the main resistor corresponding to the least significant bit and working towards the main resistor corresponding to the most significant bit, and trimming a trimming resistor immediately to the less significant bit side of an over-trimmed main resistor such that the current generated by each main resistor corresponding to less significant bits generates a current equal to the current generated by the overtrimmed resistor.

2. A transient-free high accuracy digital-to-analog converter comprising:

a reference voltage source, ground, and a load;

an output bus connected to said load;

a resistor network including a serially-connected string of trimming resistors, one end of which being connected to said reference voltage source, and equal-current defining resistors connected at one end thereof to junctions between adjacent trimming resistors;

means for selectively connecting the other ends of said equal-current defining resistors to ground or said output bus so as to generate equally weighted currents summed at said bus; and, means for converting a binary input code into a signal coupled to said selective connection means for controlling the selective connection of said equal-current defining resistors to said output bus such that an incremental increase in the binary input code causes an additional one of said equally weighted currents to be applied to said output bus, whereby overtrimming of an equal-current defining resistor corresponding to a bit may be compensated for by the trimming resistor which controls the current through all lower significant bits.

3. The converter of claim 1 wherein said reference voltage includes a reference voltage bus and wherein the resistive elements are laid out between said reference voltage bus and said output bus so as to facilitate resistor trimming.

4. The converter of claim 1 and further including a high impedance operational amplifier having an input coupled to said output bus, whereby the effect of switching on said converter is minimized.

5. The converter of claim 1 wherein said selective connection means includes a latch circuit connected to the output of said converting means; and means for reading out said latch circuit so as to actuate said selective connection means to simultaneously effect all switching.

* * * * *